United States Patent
Wahlstrom et al.

(10) Patent No.: US 7,623,378 B1
(45) Date of Patent: Nov. 24, 2009

(54) SELECTIVE PROGRAMMING OF NON-VOLATILE MEMORY FACILITATED BY SECURITY FUSES

(75) Inventors: Mose Wahlstrom, Hillsboro, OR (US); Wei Han, Hillsboro, OR (US); Yoshita Yerramilli, Hillsboro, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 228 days.

(21) Appl. No.: 11/416,881

(22) Filed: May 2, 2006

(51) Int. Cl.
  *G11C 11/04* (2006.01)
(52) U.S. Cl. .................................. 365/185.04
(58) Field of Classification Search ............. 365/185.04
  See application file for complete search history.

(56) References Cited

U.S. PATENT DOCUMENTS

| | | | |
|---|---|---|---|
| 4,852,044 A | | 7/1989 | Turner |
| 4,887,239 A | | 12/1989 | Turner |
| 4,933,898 A | * | 6/1990 | Gilberg et al. ................. 365/53 |
| 5,083,293 A | * | 1/1992 | Gilberg et al. .......... 365/189.16 |
| 6,041,007 A | * | 3/2000 | Roeckner .................. 365/225.7 |
| 6,445,606 B1 | * | 9/2002 | Khoury ........................ 365/96 |
| 2006/0067099 A1 | * | 3/2006 | Kim et al. ...................... 365/94 |
| 2006/0136717 A1 | * | 6/2006 | Buer et al. ................... 713/155 |
| 2006/0282610 A1 | * | 12/2006 | Dariel et al. ................ 711/103 |

* cited by examiner

*Primary Examiner*—Amir Zarabian
*Assistant Examiner*—Anthan T Tran
(74) *Attorney, Agent, or Firm*—Haynes and Boone, LLP

(57) ABSTRACT

Methods and devices are disclosed herein to provide improved techniques for securing configuration data stored in non-volatile memories of programmable logic devices. For example, in accordance with an embodiment of the present invention, a programmable logic device includes a non-volatile memory adapted to store a plurality of configuration data. A plurality of security fuses are adapted to store a plurality of logic states. Control logic is adapted to selectively secure the configuration data within the non-volatile memory based on the logic states stored in the plurality of security fuses.

16 Claims, 4 Drawing Sheets

SELECTIVE PROGRAMMING OF NON-VOLATILE MEMORY FACILITATED BY SECURITY FUSES

TECHNICAL FIELD

The present invention relates generally to electrical circuits and, more particularly, to the programming of non-volatile memories of programmable logic devices.

BACKGROUND

Various programmable logic devices (PLDs), such as field programmable gate arrays (FPGAs) or complex programmable logic devices (CPLDs), may be programmed with configuration data to provide various user-defined features. In certain PLDs, configuration data may be programmed into a non-volatile memory, such as a flash memory, for non-volatile storage of the configuration data that can be transferred to the volatile configuration memory to configure the PLDs.

In the course of implementing a PLD, a developer may repeatedly configure the PLD with different versions of configuration data to test the PLD for suitable operation. However, after a final version of the configuration data is determined and programmed into the non-volatile memory, the developer may wish to secure the configuration data by limiting the ability of others (for example, end users) to subsequently alter the contents of the non-volatile memory.

One approach to securing the configuration data includes the use of a single one-time-programmable (OTP) security fuse implemented as a single flash memory cell. When programmed, the single security fuse may prevent alteration of the configuration data in the non-volatile memory of the PLD. Unfortunately, this approach can cause unintended problems for developers.

For example, if a developer inadvertently programs the single security fuse before a final version of configuration data has been programmed into the non-volatile memory, then the PLD may be rendered permanently inoperable. Such accidental programming may occur, for example, as a result of a power interruption during a pre-programming operation performed on the non-volatile memory.

As another example, if the manufacturing process causes the initial "virgin" state of the single security fuse to correspond to a programmed state, the PLD may be rendered similarly inoperable. Furthermore, because the single security fuse cannot be programmed without also disabling the ability to program the non-volatile memory, it may not be possible for developers to test the single security fuse to determine its operation following manufacture.

In order to address such shortcomings of the single security fuse, developers may provide the PLD with additional circuitry and/or override features, such as a particular mode of operation authorized by a manufacturer's code or control string. Nevertheless, such provisions can create loopholes that may potentially be exploited by third parties to defeat the single security fuse.

Accordingly, there is a need for an improved approach to PLD configuration data security that, for example, reduces the likelihood of inadvertently disabling the ability to program configuration data and provides developers with reasonable opportunities to test such security features.

SUMMARY

In accordance with one embodiment of the present invention, a programmable logic device includes a non-volatile memory adapted to store a plurality of configuration data; a plurality of security fuses adapted to store a plurality of logic states; and control logic adapted to selectively secure the configuration data within the non-volatile memory based on the logic states stored in the plurality of security fuses.

In accordance with another embodiment of the present invention, a method of controlling a programmable logic device includes reading a plurality of logic states stored by a plurality of security fuses; performing a logic operation on the logic states; and selectively securing a plurality of configuration data stored in a non-volatile memory of the programmable logic device in response to the logic operation.

In accordance with another embodiment of the present invention, a programmable logic device includes a non-volatile memory; means for programming the non-volatile memory with a plurality of configuration data; means for storing a plurality of security bits; and means for securing the configuration data within the non-volatile memory based on values of the security bits.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. As an exemplary implementation, a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, within various types of circuits.

Figure 1:
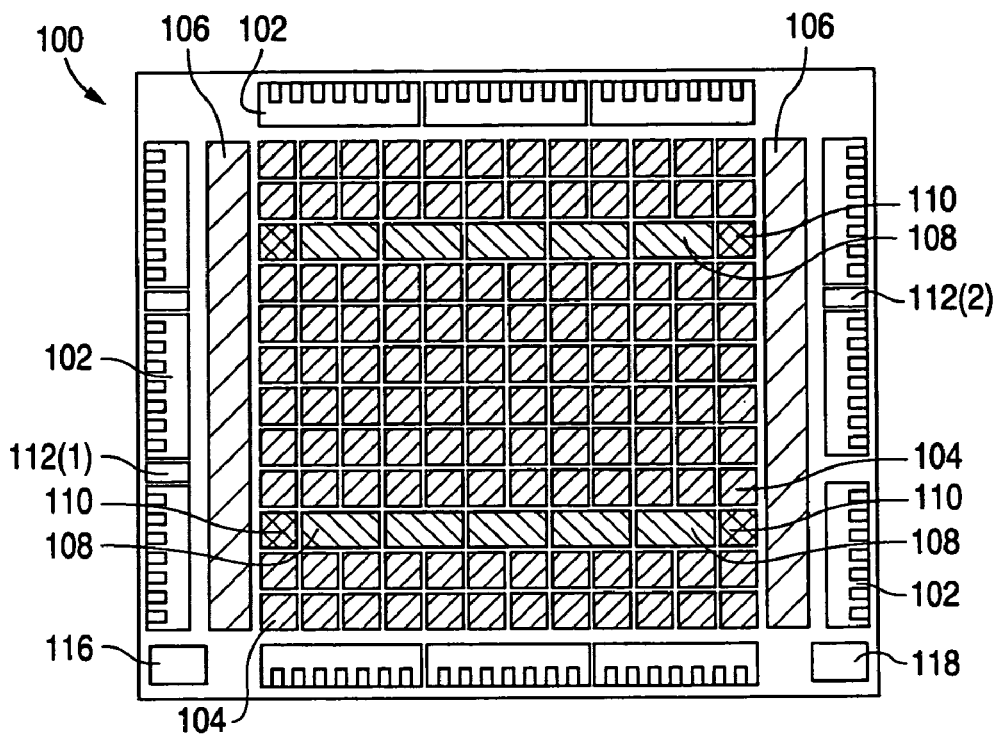
FIG. 1 illustrates a block diagram of an exemplary programmable logic device (PLD) in accordance with an embodiment of the present invention.

FIG. 1 illustrates a block diagram of an exemplary PLD 100 in accordance with an embodiment of the present invention. PLD 100 includes input/output (I/O) blocks 102 and programmable logic blocks 104 (also referred to in the art as configurable logic blocks or logic array blocks), which are used to provide I/O functionality (e.g., one or more I/O and/or memory interface standards) and logic functionality (e.g., LUT-based logic), respectively, for PLD 100. PLD 100 may also include reprogrammable non-volatile memory 106, volatile memory 108 (e.g., block SRAM), and clock-related circuitry 110 (e.g., PLL circuits). It will be appreciated that non-volatile memory 106 may be implemented as flash memory or other types of non-volatile memory that may be reprogrammed once or repeatedly.

PLD 100 may further include configuration memory 116 and interconnect 118. Furthermore, it should be understood that the elements of FIG. 1 are illustrated in block form for clarity and that certain elements, such as configuration memory 116 and interconnect 118, would typically be distributed throughout PLD 100, such as for example in and between logic blocks 104, to perform their conventional functions (e.g., storing configuration data that configures PLD 100 and providing routing resources, respectively).

PLD 100 also includes one or more data ports 112 which may be used for programming non-volatile memory 106 of PLD 100. For example, each data port 112 may represent a programming port such as a joint test action group (JTAG) port employing standards such as Institute of Electrical and Electronics Engineers (IEEE) 1149.1 or 1532 standards. In another embodiment, each data port 112 may be implemented as a serial peripheral interface (SPI) port, a central processing unit (CPU) port, or a sysCONFIG programming port.

Non-volatile memory 106 may be used to store configuration data within PLD 100 for transfer to configuration memory of PLD 100 upon power up or during reconfiguration of PLD 100. Non-volatile memory 106 may also store a plurality of security bits, as further described herein.

Figure 2:
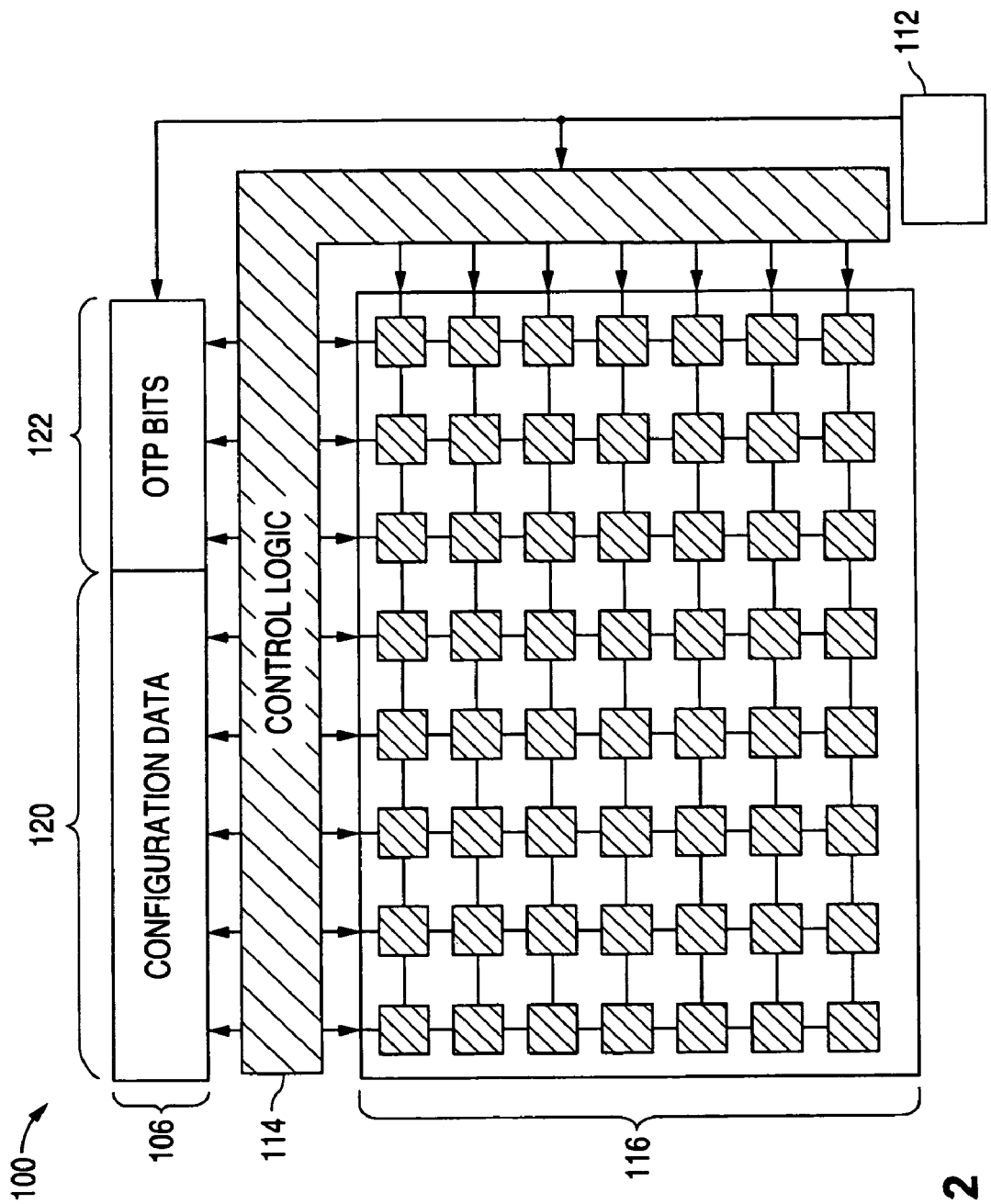
FIG. 2 illustrates a block diagram providing additional implementation details of the PLD of FIG. 1 in accordance with an embodiment of the present invention.

FIG. 2 illustrates a block diagram providing additional implementation details of PLD 100 of FIG. 1 in accordance with an embodiment of the present invention. Specifically, FIG. 2 shows non-volatile memory 106, data port 112, control logic 114, and configuration memory 116 of PLD 100.

As illustrated, non-volatile memory 106 includes a plurality of bits of configuration data 120 and a plurality of one-time-programmable (OTP) security bits 122. Configuration data 120 determines the user-defined functions of PLD 100 (e.g., determines programmable functions of I/O blocks 102 and logic blocks 104) when transferred to configuration memory 116.

OTP security bits 122 may be selectively programmed with a predetermined security pattern to inhibit further programming, erasing, or reading of non-volatile memory 106. In this regard, appropriate circuitry of PLD 100 may be disabled to inhibit such operations as will be understood by those skilled in the art. Accordingly, OTP security bits 122 may effectively be operated as a plurality of security fuses that, when set in accordance with the predetermined security pattern, can secure configuration data 120 in non-volatile memory 106.

In one embodiment, OTP security bits 122 may be implemented as eight bits of non-volatile memory 106, however it will be appreciated that any plural number of bits (for example, 2 or more bits) may be used for OTP security bits 122. Although OTP security bits 122 are illustrated as being implemented as a set of non-volatile memory cells, it will be appreciated that OTP security bits 122 may alternatively be implemented in accordance with any appropriate circuitry such as EEPROMS, non-flash OTP fuses (for example OTP polycide resistors), OTP anti-fuses, OTP capacitors, and/or other types of OTP circuitry known in the art.

Configuration memory 116 may be implemented as volatile memory such as volatile SRAM cells, non-volatile memory (e.g., in embodiments where non-volatile memory 106 is not present) such as fuses or anti-fuses. Configuration memory 116 is used to store configuration data 120 which may be loaded into configuration memory 116 from non-volatile memory 106. It will be appreciated that the device functionality of PLD 100 may be determined by the configuration data 120 stored in configuration memory 116.

Control logic 114 controls the transfer of configuration data 120 from non-volatile memory 106 to configuration memory 116. In addition, the programming of non-volatile memory 106 can be managed by control logic 114 in accordance with the particular data pattern programmed into OTP security bits 122, as further described herein.

Figure 3:
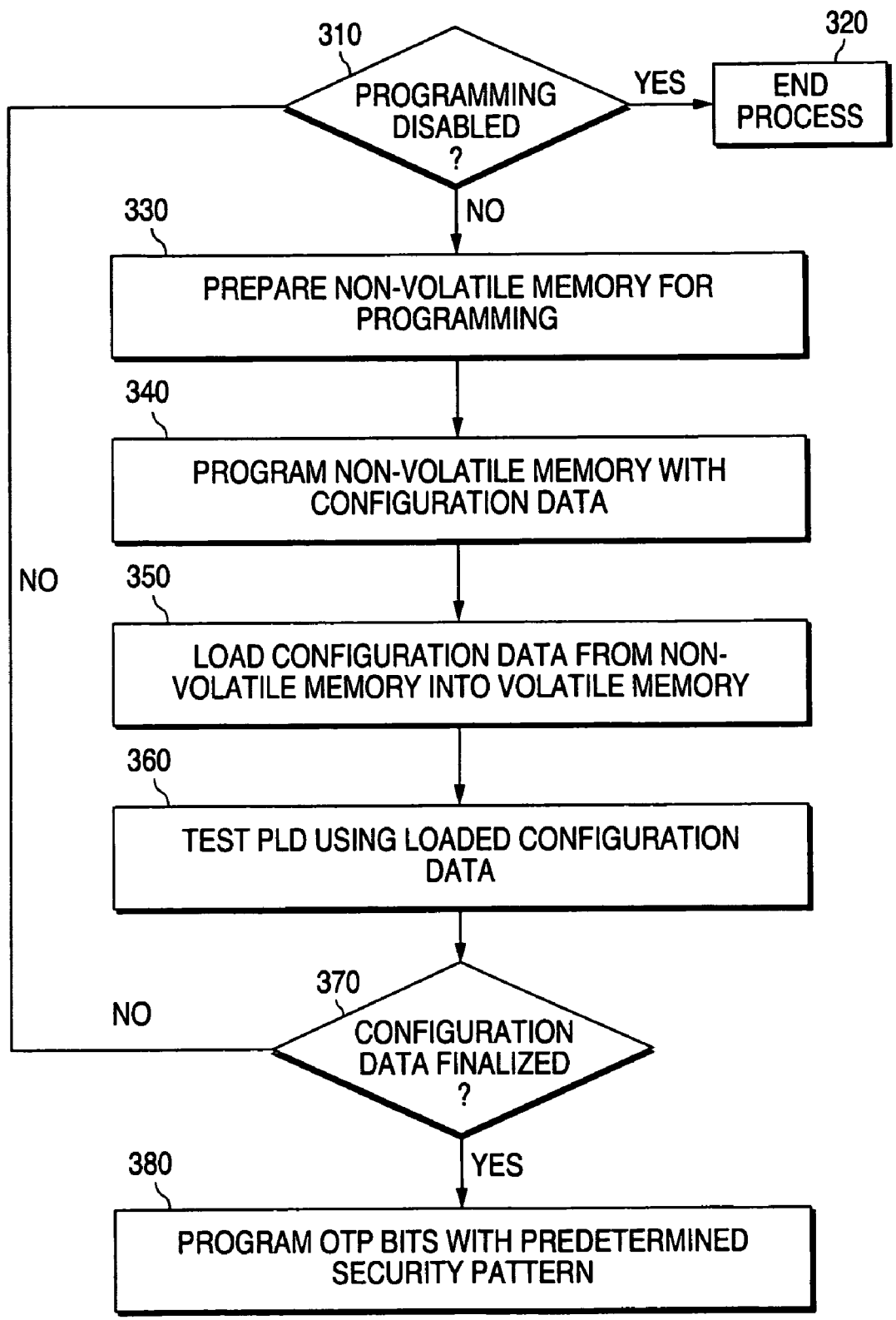
FIG. 3 illustrates a process of programming a non-volatile memory of the PLD of FIG. 1 in accordance with an embodiment of the present invention.

FIG. 3 illustrates a process of programming non-volatile memory 106 of PLD 100 in accordance with an embodiment of the present invention. In one embodiment, FIG. 3 may be performed in the course of developing configuration data 120 suitable for use in PLD 100. In addition, it will be appreciated that various operations of FIG. 3 may be controlled by one or more instructions received by PLD 100 from appropriate software or hardware in communication with PLD 100 through data port 112, as would be understood by one skilled in the art.

At initial operation 310, PLD 100 determines whether programming of non-volatile memory 106 has been disabled as a result of a previously-programmed security pattern residing in OTP security bits 122. In one embodiment, this determination can be performed by detecting a value of a control signal asserted in response to the performance of the process of FIG. 5 which is further described herein. If programming of non-volatile memory 106 has been disabled, then the process of FIG. 3 ends (operation 320). Otherwise, the process proceeds to operation 330.

At operation 330, memory cells (for example, flash memory cells) of non-volatile memory 106 of PLD 100 are prepared for programming. In this regard, it will be appreciated that prior to operation 330, the contents (i.e., the stored logic states) of non-volatile memory 106 may be unknown. Accordingly, in operation 330 the entire contents of non-volatile memory 106 (i.e., including non-volatile memory cells associated with configuration data 120 and OTP security bits 122) may be pre-programmed in a bit-by-bit fashion and bulk erased.

Operation 330 may also include additional conventional operations associated with the erasure of non-volatile memories such as a self-convergent programming operation, an erase verification operation, and a soft programming operation. It will be appreciated that following operation 330, all non-volatile memory cells of non-volatile memory 106 may exhibit a logical low state and are prepared to be programmed in subsequent operations of FIG. 3.

At operation 340, configuration data 120 is loaded through data port 112 and programmed into non-volatile memory 106. Meanwhile, also during operation 340, OTP security bits 122 may remain unprogrammed or alternatively be programmed for testing purposes.

In subsequent operation 350, configuration data 120 which was programmed during previous operation 340 may be loaded into configuration memory 116 of PLD 100. The functionality of PLD 100 determined by the loaded configuration data 120 may then be tested in operation 360. If the particular version of configuration data 120 programmed and loaded in operations 340 and 350, respectively, is deemed unacceptable (for example, by a developer) in operation 370, then the process of FIG. 3 returns to operation 310 wherein operations 310 through 370 may be repeated until configuration data 120 provides acceptable functionality and is therefore finalized.

After configuration data 120 is finalized (operation 370), OTP security bits 122 may be programmed with logic states corresponding to a predetermined security pattern in operation 380. In an alternate embodiment, OTP security bits 122 may be programmed with configuration data 120 in operation 340. As further described herein, the security pattern may be read by appropriate circuitry of PLD to inhibit subsequent programming of non-volatile memory 106. It will be appreciated that by preventing non-volatile memory 106 from being further programmed, the contents of configuration data 120 can be permanently locked by a developer. As a result, the ability to program configuration data 120 into non-volatile memory 106 can be conditioned on the logic states stored by OTP security bits 122.

In view of the foregoing, it will be appreciated that if the process of FIG. 3 is interrupted, configuration data 120 as well as OTP security bits 122 may be inadvertently left in particular programmed or unprogrammed states. For example, if operation 330 is interrupted following a pre-programming portion of the operation but before a bulk erase portion of the operation, then all of OTP security bits 122 may be left in a programmed state. As another example, if the process of FIG. 3 is interrupted following operation 330 but before operation 380, then all of OTP security bits 122 may be left in an unprogrammed state.

In addition, it may be desirable to test OTP security bits 122 to ensure that they may be programmed and erased. For example, in one embodiment, adjacent OTP security bits 122 may be alternately programmed and erased in a "checkerboard" or "checkerboard-bar" pattern to ensure satisfactory performance.

Accordingly, it will be appreciated that if the security pattern programmed in operation 380 corresponds to a bulk erased pattern, bulk programmed pattern, or checkerboard/checkerboard-bar pattern, one or more of the circumstances described above may cause PLD 100 to be accidentally locked to prevent subsequent programming of non-volatile memory 106. As a result, in various embodiments, the security pattern programmed in operation 380 may be implemented so as to not correspond to a bulk erased pattern (e.g., all of OTP security bits 122 being set to logical low values), a bulk programmed pattern (e.g., all of OTP security bits 122 being set to logical high values), or a checkerboard/checkerboard-bar pattern (e.g., OTP security bits 122 being set to alternating logical high and logical low values).

Figure 4:
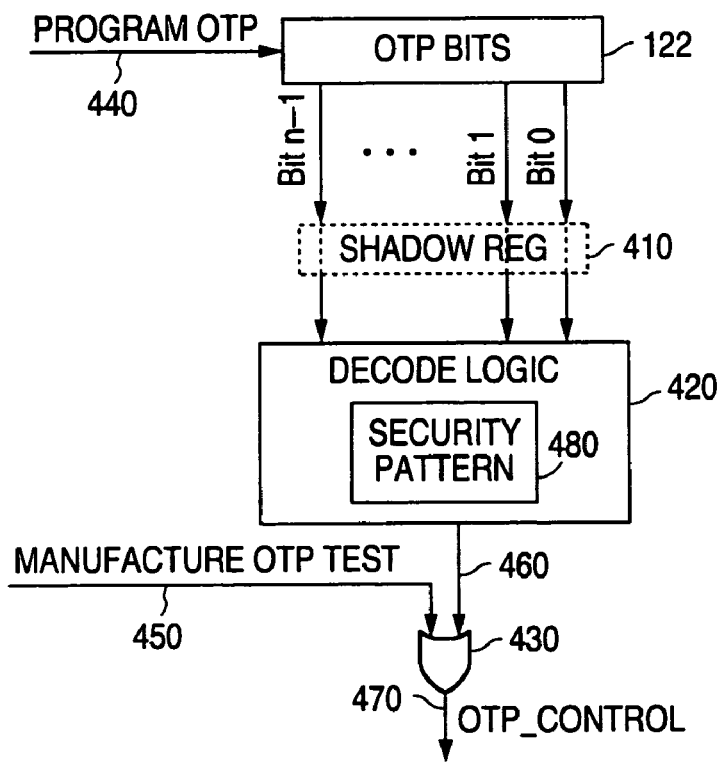
FIG. 4 illustrates various components implementing logic operations to selectively enable or disable programming a non-volatile memory of the PLD of FIG. 1 in accordance with an embodiment of the present invention.

FIG. 4 illustrates exemplary components of PLD 100 used to implement logic operations to selectively enable or disable programming of non-volatile memory 106 in accordance with an embodiment of the present invention. In particular, FIG. 4 shows OTP security bits 122 (i.e., a portion non-volatile memory 106 containing OTP security bits 122), a register 410 (labeled "SHADOW REG"), decode logic 420 including a predetermined security pattern 480 to provide a comparison result 460, a logic gate 430 (e.g., an OR logic gate), a programming instruction 440 (e.g., a signal labeled "PROGRAM OTP"), a test signal 450 (labeled "MANUFACTURE OTP TEST"), and a control signal 470 (labeled "OTP_CONTROL"). In one embodiment, one or more of the components illustrated in FIG. 4 may be provided by control logic 114.

Programming instruction 440 may correspond to an instruction received by PLD 100 through data port 112 to program OTP security bits 122 with a predetermined OTP security pattern as previously discussed with regard to operation 380 of FIG. 3. Register 410 may be used to temporarily store logic states of OTP security bits 122 read during the process of FIG. 5, as further described herein. Decode logic 420 may be implemented with any appropriate logic for comparing the logic states of OTP security bits 122 with security pattern 480 to provide comparison result 460.

Logic gate 430 may be implemented to provide a control signal 470 based on a test signal 450 and comparison result 460. For example, if logic gate 430 is an OR gate and test signal 450 or comparison result 460 is asserted (e.g., corresponding to a logical high value), then control signal 470 is asserted to disable programming of non-volatile memory 106 as previously discussed in relation to operations 310 and 320 of FIG. 3. Test signal 450 may be selectively enabled by a manufacturer to emulate the circumstances under which OTP security bits 122 have been successfully programmed with security pattern 480.

Figure 5:
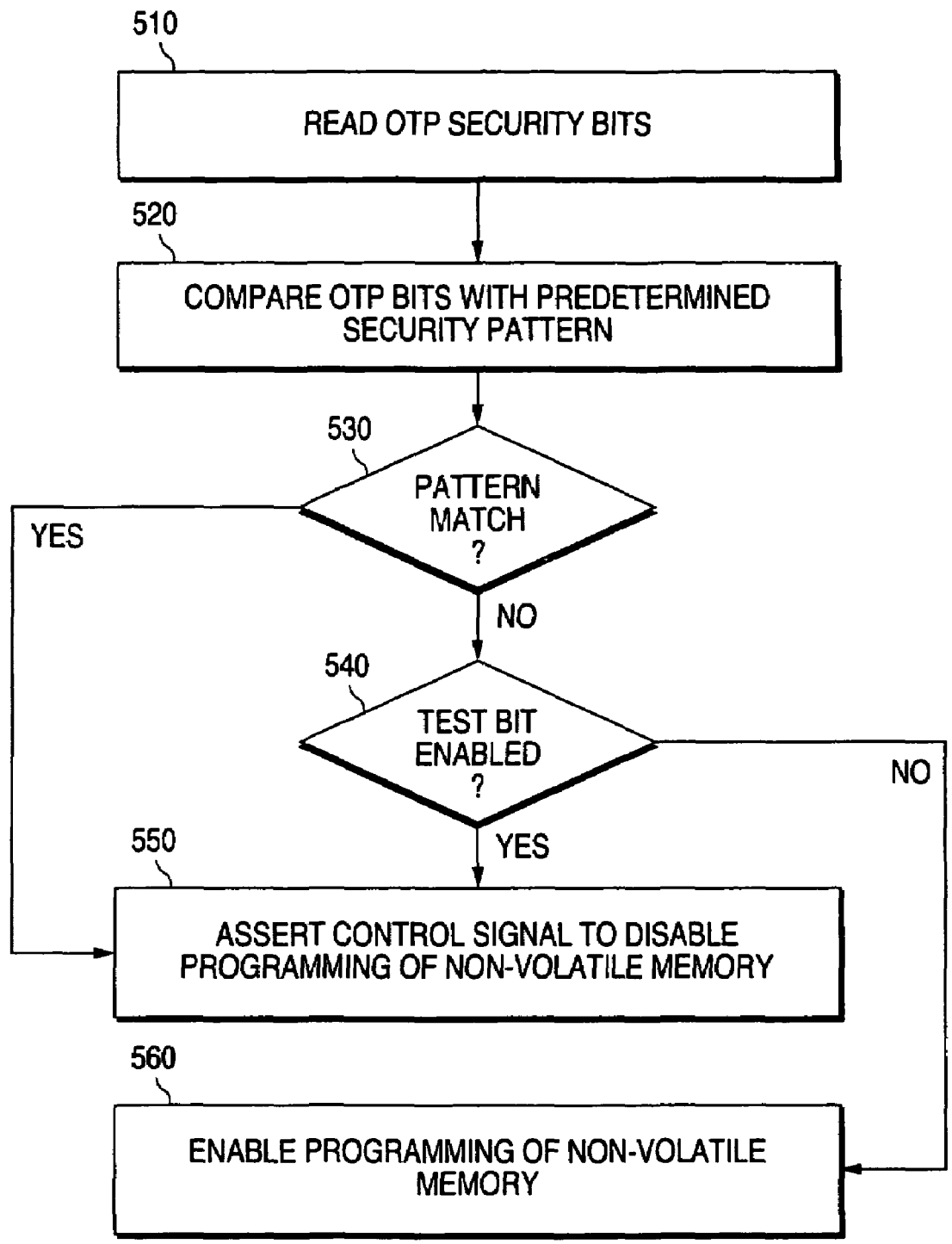
FIG. 5 illustrates a process of selectively enabling or disabling programming of a non-volatile memory of the PLD of FIG. 1 in accordance with an embodiment of the present invention.

FIG. 5 illustrates a process of selectively enabling or disabling programming of non-volatile memory 106 of PLD 100 in accordance with an embodiment of the present invention. In one embodiment, the process of FIG. 5 may be performed by various circuitry of PLD 100 illustrated in FIG. 4.

In operation 510, OTP security bits 122 are read. In this regard, the logic states (i.e., data values) of OTP security bits 122 may be provided to register 410 as illustrated in FIG. 4. In another embodiment, register 410 may be replaced by a plurality of sense amplifiers adapted to read (i.e., detect) the logic states of OTP security bits 122. The logic states are passed from register 410 (or alternatively, from sense amplifiers) to decode logic 420.

At operation 520, decode logic 420 compares the logic states stored by OTP security bits 122 with OTP security pattern 480 to obtain a comparison result 460. In one embodiment, OTP security pattern 480 may be implemented in decode logic 420 as hardwired circuitry. In another embodiment, OTP security pattern 480 need not be provided in decode logic 420. In such an embodiment, decode logic 420 may perform a logic operation directly on the logic states stored by OTP security bits 122 such as, for example, a comparison of a first portion of OTP security bits 122 to a second portion of OTP security bits 122 to obtain comparison result 460. It will be appreciated that decode logic 420 may be implemented to perform an appropriate comparison algorithm (e.g., an inversion of the first portion or the second portion of OTP security bits 122) during operation 520.

Comparison result 460 is provided to logic gate 430 where a logical operation is performed on comparison result 460 and test signal 450. If either comparison result 460 or test signal 450 correspond to logical high states, then control signal 470 is asserted to disable further programming of non-volatile memory 106. For example, in one embodiment, control signal 470 may be provided to appropriate circuitry of control logic 114 to prevent further programming of non-volatile memory 106.

Upon inspection of FIG. 4, it will be appreciated that control signal 470 will correspond to a logical high state (i.e., a "1" value) if one or both of test signal 450 and comparison result 460 correspond to logical high states. Conversely, control signal 470 will correspond to a logical low state (i.e., a "0" value) only if both test signal 450 and comparison result 460 correspond to logical low states.

The operation of logic gate 430 is represented conceptually in FIG. 5 by decision points (i.e., operations) 530 and 540. Specifically, if comparison result 460 indicates that the logic states of OTP security bits 122 match OTP security pattern 480, then the process of FIG. 5 proceeds to operation 550 in which control signal 470 is asserted to disable further programming of non-volatile memory 106. Alternatively, if no match is found, then the process proceeds to operation 540.

At operation 540, a determination is made as to whether test signal 450 has been enabled. If test signal 450 has been enabled, then PLD 100 will emulate the state in which OTP security bits 122 have been programmed. As a result, the process of FIG. 5 proceeds to operation 550 previously described herein. However, if test signal 450 has not been enabled, then control signal 470 will not be enabled and the process of FIG. 5 proceeds to operation 560 in which non-volatile memory 106 is permitted to be further programmed.

It will be appreciated that the process of FIG. 3 may be optionally performed following operation 560. In this manner, a developer may continue to program non-volatile memory 106 with alternate variations of configuration data 120 for further testing, experimentation, and/or other purposes.

In view of the present disclosure, it will be appreciated that an approach to the securing of configuration data in accordance with the various embodiments set forth herein can reduce the likelihood of PLD 100 being rendered inoperable as a result of the accidental programming of a single security fuse by a developer or as a result of such a single security fuse being left in a programmed state following manufacture. Rather, through the implementation of a plurality of security fuses (e.g., OTP security bits 122), configuration data 120 may be repeatedly programmed into non-volatile memory 106 of PLD 100 until security pattern 480 is programmed into OTP security bits 122.

In addition, through implementation of test signal 450, the programming of OTP security bits 122 can be emulated for testing purposes without permanently disabling the ability to further program non-volatile memory 106. Moreover, because test signal 450 does not disable OTP security bits 122 to emulate an unprogrammed state, it does not provide an exploitable security loophole to third parties.

Embodiments described above illustrate but do not limit the invention. For example, although OTP security bits 122 have been described with reference to flash memory cells, it will be appreciated that implementations utilizing other types of OTP fuses are also contemplated by the present disclosure. As another example, although various aspects of the present invention have been described with reference to one or more particular logic operations, it will be further appreciated that the programming of non-volatile memory 106 may be selectively enabled or disabled in accordance with any desired logic operations as may be appropriate in particular applications.

It should also be understood that numerous modifications and variations are possible in accordance with the principles of the present invention. Accordingly, the scope of the invention is defined only by the claims.

We claim:

1. A method of controlling the programming of non-volatile memory with configuration data in a programmable logic device, comprising:
   storing in a plurality of programmable security fuses within the device a multiple bit security pattern;
   comparing within the device multiple bits of the multiple bit security pattern with multiple bits of a predetermined multiple bit security pattern;
   if the security patterns match, disabling programming of the non-volatile memory;
   if the security patterns do not match, determining whether a test bit within the device has been enabled;
   if the test bit is enabled, disabling programming of the non-volatile memory with the configuration data; and
   if the test bit is not enabled, enabling programming of the non-volatile memory with the configuration data.

2. The method of claim 1,
   wherein comparing within the device multiple bits of the multiple bit security pattern with multiple bits of a predetermined multiple bit security pattern comprises comparing one portion of the stored multiple bit security pattern with another portion.

3. The method of claim 1,
   wherein comparing within the device multiple bits of the multiple bit security pattern with multiple bits of a predetermined multiple bit security pattern comprises comparing a predetermined multiple bit security pattern hardwired into the control logic with the stored multiple bit security pattern.

4. The method of claim 1, wherein the security fuses are memory cells of the non-volatile memory.

5. The method of claim 1, wherein the security fuses are one-time programmable (OTP) fuses.

6. The method of claim 1, wherein the non-volatile memory is flash memory.

7. The method of claim 1, wherein the predetermined multiple bit security pattern is not a bulk erased pattern, a bulk programmed pattern, a checkerboard pattern, or a checkerboard-bar pattern.

8. A programmable logic device comprising:
   programmable non-volatile memory for storing configuration data for the device;
   a plurality of programmable security fuses for storing a multiple bit security pattern; and
   control logic operable for:
      comparing within the device multiple bits of the multiple bit security pattern with multiple bits of a predetermined multiple bit security pattern;
      if the security patterns match, disabling programming of the non-volatile memory;
      if the security patterns do not match, determining whether a test bit within the device has been enabled;
      if the test bit is enabled, disabling programming of the non-volatile memory with the configuration data; and
      if the test bit is not enabled, enabling programming of the non-volatile memory with the configuration data.

9. The programmable logic device of claim 8, wherein, in comparing a multiple bit security pattern stored in the security fuses with a predetermined multiple bit security pattern, the control logic is operable for compare to portion of the stored multiple bit security pattern with another portion.

10. The programmable logic device of claim 8, wherein, in comparing a multiple bit security pattern stored in the security fuses with a predetermined multiple bit security pattern, the control logic is operable to compare a predetermined multiple bit security pattern hardwired into the control logic with the stored multiple bit security pattern.

11. The programmable logic device of claim 8, wherein the control logic comprises:
   decode logic for comparing the stored multiple bit security pattern with the predetermined multiple bit security pattern; and
   an OR gate coupled at its inputs to the output of the decode logic and to a signal path for receiving the test signal, the output of the OR gate operable to provide a control signal for enabling or disabling programming of the non-volatile memory.

12. The programmable logic device of claim 8, wherein the security fuses are memory cells of the non-volatile memory.

13. The programmable logic device of claim 8, wherein the security fuses are one-time programmable (OTP) fuses.

14. The programmable logic device of claim 8, wherein the non-volatile memory is flash memory.

15. The programmable logic device of claim 8, wherein the predetermined multiple bit security pattern is not a bulk erased pattern, a bulk programmed pattern, a checkerboard pattern, or a checkerboard-bar pattern.

16. A programmable logic device comprising:

programmable non-volatile memory for storing configuration data for the device;

a plurality of programmable security fuses for storing a multiple bit security pattern; and means for:

comparing within the device multiple bits of the multiple bit security pattern with multiple bits of a predetermined multiple bit security pattern;

if the security patterns match, disabling programming of the non-volatile memory;

if the security patterns do not match, determining whether a test bit within the device has been enabled;

if the test bit is enabled, disabling programming of the non-volatile memory with the configuration data; and if the test bit is not enabled, enabling programming of the non-volatile memory with the configuration data.

\* \* \* \* \*

UNITED STATES PATENT AND TRADEMARK OFFICE
CERTIFICATE OF CORRECTION

| | |
|---|---|
| PATENT NO. | : 7,623,378 B1 |
| APPLICATION NO. | : 11/416881 |
| DATED | : November 24, 2009 |
| INVENTOR(S) | : Mose Wahlstrom, Wei Han and Yoshita Yerramilli |

It is certified that error appears in the above-identified patent and that said Letters Patent is hereby corrected as shown below:

Column 8, line 47: change "operable for compare to portion" to --operable to compare a portion--.

Signed and Sealed this
Seventeenth Day of January, 2012

David J. Kappos
*Director of the United States Patent and Trademark Office*